(12) United States Patent
Trimberger (10) Patent No.: US 8,823,405 B1
(45) Date of Patent: Sep. 2, 2014

(54) INTEGRATED CIRCUIT WITH POWER GATING

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1027 days.

(21) Appl. No.: 12/880,011

(22) Filed: Sep. 10, 2010

(51) Int. Cl.
*G01R 31/3187* (2006.01)

(52) U.S. Cl.
USPC .............. 324/750.3; 324/726.01; 324/762.05

(58) Field of Classification Search
USPC ....................................................... 324/750.3
See application file for complete search history.

(56) References Cited

U.S. PATENT DOCUMENTS

| | | | |
|---|---|---|---|
| 4,962,341 A | 10/1990 | Schoeff | |
| 5,303,390 A | 4/1994 | Little | |
| 5,313,158 A * | 5/1994 | Joosten et al. | ............ 324/762.05 |
| 5,362,989 A | 11/1994 | Hennedy | |
| 5,404,099 A * | 4/1995 | Sahara | ........................ 324/750.3 |
| 5,519,663 A | 5/1996 | Harper et al. | |
| 5,568,062 A | 10/1996 | Kaplinsky | |
| 5,583,457 A | 12/1996 | Horiguchi | |
| 5,612,892 A | 3/1997 | Almulla | |
| 5,615,162 A | 3/1997 | Houston | |
| 5,682,107 A | 10/1997 | Tavana et al. | |
| 5,712,790 A | 1/1998 | Ditlow et al. | |
| 5,801,548 A | 9/1998 | Lee et al. | |
| 5,811,962 A | 9/1998 | Ceccherelli et al. | |
| 5,825,662 A | 10/1998 | Trimberger | |
| 5,832,286 A | 11/1998 | Yoshida | |
| 5,914,873 A | 6/1999 | Blish | |
| 5,946,257 A | 8/1999 | Keeth | |
| 5,958,026 A | 9/1999 | Goetting et al. | |
| 6,038,386 A | 3/2000 | Jain | |
| 6,114,843 A | 9/2000 | Olah | |
| 6,148,390 A | 11/2000 | MacArthur et al. | |
| 6,160,418 A | 12/2000 | Burnham | |
| 6,169,419 B1 | 1/2001 | De et al. | |
| 6,172,518 B1 | 1/2001 | Jenkins | |
| 6,208,171 B1 | 3/2001 | Kumagai et al. | |
| 6,384,626 B2 | 5/2002 | Tsai et al. | |
| 6,466,049 B1 | 10/2002 | Diba et al. | |
| 6,486,712 B1 | 11/2002 | Landry et al. | |
| 6,489,804 B1 | 12/2002 | Burr | |
| 6,583,645 B1 | 6/2003 | Bennett et al. | |
| 6,631,502 B2 | 10/2003 | Buffet et al. | |
| 6,710,621 B2 | 3/2004 | Devlin et al. | |
| 6,711,719 B2 | 3/2004 | Cohn et al. | |
| 6,747,478 B2 | 6/2004 | Madurawe | |
| 6,839,888 B2 | 1/2005 | Gupta | |
| 6,885,563 B2 | 4/2005 | Panella et al. | |

(Continued)

OTHER PUBLICATIONS

US 6,981,160, 12/2005, Thaker et al. (withdrawn).

(Continued)

*Primary Examiner* — Richard Isla Rodas
(74) *Attorney, Agent, or Firm* — Scott Hewett; John J. King (57) ABSTRACT

An integrated circuit has a first independent power domain having a first power domain bus electrically connected to first functional blocks and a first power pad electrically connected to the first power domain bus and a second independent power domain having a second power domain bus electrically connected to second functional blocks and a second power pad electrically connected to the second power domain bus. A test element is between the first power domain bus and the second power domain bus.

13 Claims, 5 Drawing Sheets

(56) References Cited

U.S. PATENT DOCUMENTS

| | | | |
|---|---|---|---|
| 6,920,627 | B2 | 7/2005 | Blodget et al. |
| 6,936,917 | B2 | 8/2005 | Lopata et al. |
| 6,937,496 | B2 | 8/2005 | Mizuno |
| 6,950,998 | B1 | 9/2005 | Tuan |
| 6,960,934 | B2 | 11/2005 | New |
| 6,968,467 | B2 | 11/2005 | Inoue et al. |
| 7,003,620 | B2 | 2/2006 | Avraham et al. |
| 7,071,730 | B2 | 7/2006 | Cordoba |
| 7,075,839 | B2* | 7/2006 | Mukunoki et al. ............ 365/201 |
| 7,078,932 | B2 | 7/2006 | Swami |
| 7,080,341 | B2 | 7/2006 | Eisenstadt et al. |
| 7,098,689 | B1 | 8/2006 | Tuan et al. |
| 7,109,748 | B1 | 9/2006 | Liu et al. |
| 7,112,997 | B1 | 9/2006 | Liang et al. |
| 7,135,886 | B2 | 11/2006 | Schlacter |
| 7,170,315 | B2 | 1/2007 | Bakker et al. |
| 7,183,671 | B2* | 2/2007 | Kawanishi et al. ........... 307/130 |
| 7,256,604 | B1* | 8/2007 | Ota et al. ................. 324/762.01 |
| 7,295,036 | B1 | 11/2007 | Zaveri et al. |
| 7,295,051 | B2 | 11/2007 | Li et al. |
| 7,313,706 | B2 | 12/2007 | Williams et al. |
| 7,313,708 | B2 | 12/2007 | Oshins |
| 7,315,951 | B2 | 1/2008 | Hanrieder et al. |
| 7,332,941 | B2* | 2/2008 | Ishii ................................ 327/96 |
| 7,345,944 | B1 | 3/2008 | Jenkins |
| 7,425,720 | B2 | 9/2008 | Kaeriyama et al. |
| 7,475,184 | B2 | 1/2009 | Lee |
| 7,490,302 | B1 | 2/2009 | Rahman et al. |
| 7,498,835 | B1 | 3/2009 | Rahman et al. |
| 7,498,836 | B1 | 3/2009 | Tuan |
| 7,498,839 | B1 | 3/2009 | Jenkins, IV |
| 7,504,854 | B1 | 3/2009 | Look et al. |
| 7,549,139 | B1 | 6/2009 | Tuan et al. |
| 7,562,332 | B1 | 7/2009 | Tuan et al. |
| 7,568,177 | B1 | 7/2009 | Soebroto et al. |
| 7,581,129 | B2 | 8/2009 | Samson et al. |
| 7,583,551 | B2 | 9/2009 | Klein |
| 7,590,962 | B2 | 9/2009 | Frenkil et al. |
| 7,714,610 | B2 | 5/2010 | He |
| 7,739,537 | B2 | 6/2010 | Albonesi et al. |
| 8,575,952 | B2* | 11/2013 | Kawasaki .................. 324/750.3 |
| 2003/0030326 | A1 | 2/2003 | Shenai et al. |
| 2003/0218478 | A1 | 11/2003 | Sani et al. |
| 2004/0232937 | A1* | 11/2004 | Ishibashi ...................... 324/765 |
| 2006/0061378 | A1* | 3/2006 | Poechmueller ............... 324/765 |
| 2006/0069851 | A1 | 3/2006 | Chung et al. |
| 2006/0119382 | A1 | 6/2006 | Shumarayev et al. |
| 2006/0202713 | A1 | 9/2006 | Shumarayev |
| 2012/0146673 | A1* | 6/2012 | Kim et al. .................. 324/750.3 |

OTHER PUBLICATIONS

U.S. Appl. No. 10/606,619, filed Oct. 26, 2003; New, Bernard et al., Xilinx, Inc., San Jose, CA 95124.

U.S. Appl. No. 12/491,174, filed Jun. 24, 2009, Tuan, Tim et al., Xilinx, Inc., San Jose, CA 95124.

Allen/Holberg, Chapter 10; "Bandgap Voltage Reference"; Apr. 12, 2000; downloaded on Jan. 3, 2006 from www.ece.utexas.edu/~holberg/lecture_notes/bandgap.pdf; pp. 1-5.

Burd, Thomas D., et al., "A Dynamic Voltage Scaled Microprocessor System"; 2000 IEEE; IEEE Journal of Solid-State Circuits, vol. 35, No. 11, Nov. 2000; pp. 1571-1580.

Davis, J. et al., "A Stochastic Wire-Length Distribution for Gigascale Integration (GSI)—Part II Applications to Clock Frequency, Power Dissipation, and Chip Size Estimation", IEEE Transactions on Electron Devices, vol. 45, No. 3, Mar. 1998, pp. 590-597.

De, Vivek et al., "Techniques for Leakage Power Reduction", Design of High-Performance Microprocessor Circuits, Sep. 200, pp. 46-62, available from IEEE Books, IEEE 3 Park Avenue, $17^{th}$ Floor, New York, NY 10016-5997.

FPGA 2004 Advance Program; ACM/SIGDA Eleventh international Symposium on Field Programmable Gate Arrays, Feb. 22-24, 2004, 6 pages, at Monterey Beach Hotel, Monterey, California, available at http://fpga2004.ece.ubc.ca/.

Hamzaoglu, Fatih et al., "Circuit-Level Techniques to Control Gate Leakage for Sub-100nm CMOS", ISLPED, Aug. 12-14, 2002, pp. 60-63, available from IEEE, 3 Park Avenue, 17th Floor, New York, NY 10016-5997.

He, Lei, "Power Efficient FPGA: Circuit, Fabrics and CAD Algorithms," Presentation on Feb. 13, 2004, 50 pages, at Xilinx, Inc. 2100 Logic Drive, San Jose, CA 95124, available from EE Department, UCLA, at http://eda.ee.ucla.edu/.

Intel Corporation, "Intel PXA27x Processor Family Power Requirements", Application Note, 2004, pp. 1-36, available from Intel Corporation (Santa Clara) Corporate Office, 2200 Mission College Blvd., Santa Clara, California 95052-8119.

Inukai, T. et al., "Boosted Gate MOS (BGMOS): Device/Circuit Cooperation Scheme to Achieve Leakage-Free Giga-Scale Integration" IEEE 2000 Custom Integrated Circuits Conference, May 21-24, 2000, pp. 409-412, available from IEEE, 3 Park Avenue, 17th Floor, New York, NY 10016-5997.

Kaushik, R. et al., "Leakage Current Mechanisms and leakage Reduction Techniques in Deep-Submicrometer CMOS Circuits", Feb. 2003, pp. 305-327, vol. 91, No. 2, available from IEEE, 3 Park Avenue, $17_{th}$ Floor, New York, NY 10016-5997.

Kuroda, Tadahiro et al., "A 0.9-V, 150-MHz, 10-mW, 4 mm2, 2-D Discrete Cosine Transform Core Processor With Variable Threshold-Voltage (VT) Scheme", Nov. 1996, pp. 1770-1779, vol. 32, No. 11, available from IEEE, 3 Park Avenue, 17th Floor, New York, NY 10016-5997.

Microchip Technology Inc.; "Micropower Voltage Supervisors"; MCP102/103/121/131; Copyright 2005; downloaded on Jan. 3, 2006 from ww1.microchip.com/downloads/en/DeviceDoc/21906b.pdf; pp. 1-28.

Mutoh, Shin'Ichiro et al., "1-V Power Supply High-speed Digital Circuit Technology with Multithreshold-Voltage CMOS", IEEE Journal of Solid-State Circuits, Aug. 1995, pp. 847-854, vol. 30, No. 8, available from IEEE, 3 Park Avenue, 17th Floor, New York, NY 10016-5997.

Nowka, Kevin J., A 32-bit PowerPC System-on-a-Chip With Support for Dynamic Voltage Scaling and Dynamic Frequency Scaling, Nov. 2002, pp. 1441-1447, vol. 37, No. 11, IEEE Journal of Solid-State Circuits, Available from IEEE; 3 Park Avenue, 17th Floor, New York, NY 10016-5997.

Park, Jae Y. , Allen, Mark G., "A Comparison of Micromachined Inductors with Different Magnetic Core Materials"; 1996 Electronic Components and Technology Conference; 1996 IEEE; May 28-31, 1996, pp. 375-381.

Stratakos, Anthony J., et al, "A Low-Voltage CMOS DC-DC Converter for a Portable Battery-Operated System"; 1994 IEEE; Jun. 20-25, 1994, pp. 619-626.

Stratakos, Anthony John, "High-Efficiency Low-Voltage DC-DC Conversion for Portable Applications," Chapter 3; "DC-DC Converter Fundamentals"; Ph. D., UC, Berkeley, CA 1998, pp. 42-78.

Takahashi, M. et al., "A 60-mW MPEG4 Video Codec Using Clustered Voltage Scaling with Variable Supply-Voltage Scheme," Nov. 1998, pp. 1772-1780, vol. 33, No. 11, available from IEEE Journal of Solid-State Circuits, IEEE, 3 Park Avenue, 17th Floor, New York, NY 10016-5997.

Texas Instruments—Datasheet BQ4011 (32×8 nonvolatile SRAM) May 1999. pp. 1-15.

Texas Instruments (BenchMARq)—Datasheet BQ4011 (32×8 nonvolatile SRAM) Aug. 1993, pp. 1-11.

Xilinx, Inc., "Spartan-3L Low Power FPGA Family", Preliminary Product Specification, DS313, Sep. 15, 2005, v1.1, pp. 1-10, available from Xilinx, Inc., 2100 Logic Drive, San Jose, CA 95124.

Xilinx, Inc., "Virtex-II Pro Platform FPGA Handbook"; published Oct. 14, 2002; available from Xilinx, Inc., 2100 Logic Drive, San Jose, CA 95124; pp. 19-71.

* cited by examiner

INTEGRATED CIRCUIT WITH POWER GATING

FIELD OF THE INVENTION

An embodiment of the invention relates generally to integrated circuits, and more particularly to techniques for selectively turning off power to unused portions of the integrated circuit.

BACKGROUND OF THE INVENTION

CMOS circuits are used in a variety of integrated circuit (IC) applications. A CMOS process can be used to fabricate many different sorts of functionality, such as memory, logic, and switching, and thus CMOS techniques are particularly desirable in applications where an IC includes several different types of functional blocks.

One family of ICs employing CMOS fabrication techniques are programmable logic devices (PLDs). PLDs are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more function blocks connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these PLDs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms PLD and programmable logic device include but are not limited to these exemplary devices, as well as encompassing devices that are only partially programmable.

Power consumption of an IC generally increases with increasing complexity (e.g., number of devices or gates) for a given fabrication technology (e.g., CMOS node spacing). In some applications, a PLD has resources that are not required for an application (i.e., in the configured PLD or other IC). For example, the application uses a portion, but not all, of the logic resources of the PLD, leaving some logic blocks unused. An unused block might still consume power, such as leakage current. De-powering unused resources of an IC conserves power and reduces the operating temperature of the IC, both of which are typically desirable.

Various techniques have been developed to conserve power in regions of an IC that are not used in a particular application. One technique is to back-bias unused regions to reduce leakage current; however, this typically uses an additional power supply for the IC. Another approach uses a switch to selectively power or depower a selected region (block) of an IC. Such a switch is often referred to as a power gate. A power gate should be of sufficiently low resistance so as to not consume significant power, significantly reduce the voltage through the device, or generate significant heat if the associated block is turned on (i.e., the power for the block flows through the power gate). This typically results in a physically large device, and a trade-off between the size of the power gate device and the acceptable degradation of performance is usually struck.

Techniques for selectively de-powering regions of an IC that avoid the disadvantages of the prior art are desirable.

SUMMARY OF THE INVENTION

An IC according to an embodiment has a first independent power domain having a first power domain bus electrically connected to first functional blocks with a first power pad electrically connected to the first power domain bus, and a second independent power domain having a second power domain bus electrically connected to second functional blocks with a second power pad electrically connected to the second power domain bus. A test element may be disposed between the first power domain bus and the second power domain bus.

In another embodiment, an IC having independent power domains and a pinout array is fabricated by defining a design for the IC. The design is compiled so as to leave at least one independent power domain having an independent power pin. A pinout connectivity for the design is generated that includes identification of the independent power pin of the at least one independent power domain in the pinout array.

In another embodiment, an IC having independent power domains connected together through test elements is tested by applying test power to the IC at a power pad to power the independent power domains through the test elements. The IC is electrically tested, and then the independent power domains are isolated from each other on the IC.

DETAILED DESCRIPTION OF THE DRAWINGS

Figure 1:
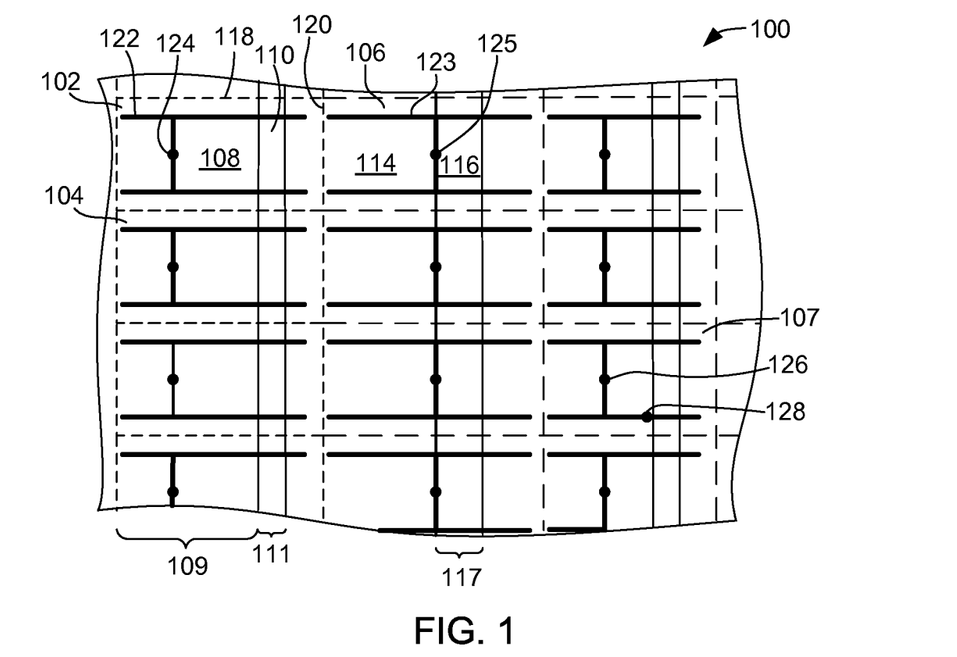
FIG. 1 is a plan view of a portion of an IC with independent power domains according to an embodiment.

FIG. 1 is a plan view of a portion of an IC 100 with independent power domains 102, 104, 106, 107 (defined by dashed lines on the floorplan of the IC) according to an embodiment. An independent power domain provides power to one or more blocks of the IC 100, such as to a configurable logic block (CLB) 108 and an input/output block (IOB) 110, or to a CLB 114 and a block of random access memory (BRAM) 116, or other functional regions of the IC. CLBs, IOBs, and BRAMs are arranged in columns 109, 111, 117 on the IC (compare, FIG. 9), with the boundaries between independent power domains indicated by dashed lines 118, 120.

In an exemplary embodiment, if each power domain is to be used for an application, each power domain is connected to a common voltage (e.g., Vcc) through independent power pads through an external connection (e.g., a wire or a trace on a printed circuit). If one or more of the independent power domains is not to be used, that power domain can remain unpowered, avoiding leakage current associated with powering unused or faulty IC resources. Although power domains are shown as non-overlapping regions, they may in fact overlap physically on the IC, yet remain distinct logically by powering different resources in the same physical area. For example, one area on a programmable chip may have one power region for programming memory and another for user logic. Similarly, alternative embodiments use non-rectangular independent power domains, such as T-shaped, H-shaped, or C-shaped independent power domains, or interleaved (interdigitated) power domains (see, e.g., FIG. 9).

In a conventional IC, a power distribution network is used to distribute power to all active blocks of the IC. The power distribution network is often laid out in a grid or tree fashion to achieve uniform voltage and power dissipation at various physical locations of the IC, and typically share several interconnections between functional blocks throughout the chip. A packaged IC typically has several power (e.g., Vcc) pins connected together through patterned metal layers (traces and vias) on the IC chip to form the power distribution network. A packaged IC typically also has several ground pins, which are also typically connected together through the patterned metal layers of the IC chip.

A power domain bus 122 is a conductive structure in a power domain 102 that distributes electrical energy to devices in the functional blocks within the power domain. There are myriad wires (traces) defined in patterned metal layers of the IC extending from the power domain bus 122 to the blocks and devices within the power domain, which are not shown for clarity of illustration. The power domain bus 122 of independent power domain 102 is electrically isolated from the power domain bus 123 of independent power domain 106 on the IC during user operation. Independent power domains may be electrically connected for purposes of electrical test of the IC (e.g., power domain buses are connected to each other), but are disconnected on the IC when used in an application. Independent power domains are independently powered or unpowered, or are connected to a common power supply on the mounting substrate of the packaged IC. The power domain bus 122 is approximately shaped like an "H"; however, alternative power domain buses have different shapes.

Each power domain has at least one power pad 124. The power pad 124 is connected to a power supply (e.g., Vcc) to provide power to the power domain 102 associated with the power domain bus 122 to provide power to the circuitry associated with the independent power domain 102, or is left unconnected or grounded if no resources within the independent power domain 102 are to be used in a design (e.g., IC configuration). A power domain may have more than one power pad, such as power domain 107, which has two power pads 126, 128.

The power pad 124 is connected to an external pin, such as a solder ball or solder bump on a connector array of a packaged IC (see, e.g., FIG. 6), a wire bond pad, or other electrical interface structure between the IC and a printed wiring board or packaging substrate. Power is provided to the IC from an external power supply through the wiring board or packing substrate to the appropriate power pads (e.g., bonding pads or solder bumps). A wiring board or packaging substrate typically has a distribution circuit (traces) so that a power supply voltage (e.g., Vcc) can be connected to several power pads. Some ICs have more than one power domain. Other power domain(s) operate at a different voltage, for example, and are connected to a different power supply voltage or to ground through a different distribution circuit on the wiring board or packaging substrate. In fixed ICs, such as microprocessors, the power domains and associated power pads used in an application are pre-defined. In programmable logic devices, such as an FPGA, the physical regions of the FPGA that are used in a particular application are not known until the application is placed into the FPGA's physical resources (commonly known as compiling the design).

In an embodiment where the IC 100 is an FPGA, the FPGA is configured according to a configuration bitstream or other configuration technique using any of several techniques well known in the art of PLDs. Generally, physical resources of the IC are defined according to a place and route tool to configure the IC to a particular application. If one or more independent power domains of the IC are not utilized in that application, the power pads associated with the unused independent power domains are not connected to the power supply. For example, if no logic or memory in power domain 102 is to be used in the configured application (IC design), power pad 124 is not connected to Vcc. In one embodiment, power pad 124 is connected to ground through a trace on the wiring board or packaging substrate. Connecting the power domain bus 122 to ground through the power pad 124 reduces leakage current that might otherwise result if power pad 124 were connected to Vcc (even though none of the logic in power domain 102 is used). In an alternative embodiment, power pads of independent power domains are connected to lower or higher voltages (e.g., lower or higher than Vcc), which allows logic in those power domains to operate at slower or higher speeds, for example.

The power gating is supplied by external connections (e.g., on the wiring board or packaging substrate), as opposed to on-chip power gating transistors, silicon area is conserved.

Similarly, the issues of on-chip power dissipation (heating) and voltage drop associated with using power gating transistors to connect independent power domains on an IC are avoided. In some applications, including re-configurable (re-programmable) applications, the customer is restricted from using powered-off regions (i.e., those IC resources in the unpowered (grounded) power domains) in the initial or subsequent configurations.

In other embodiments, the external connection (e.g., wiring board trace) connected to the power pad of an independent power domain through an independent power pin is selectively connectable to one or more voltages so that the power pad of an independent power domain on the IC can be connected or disconnected. For example, an FPGA is configured to a first application which does not use the resources associated with (i.e., within) an independent power domain. The power pad of the independent power domain is connected to ground through the external connection. The FPGA is re-configured to a second application which uses resources in the independent power domain. The power pad associated with the independent power domain is connected to a power supply (e.g., Vcc) so that the resources in the independent power domain are available for the reconfigured application. One or more independent power domains may have equivalent functionality; that is, the resources of one or more independent power domains may be configured the same.

Figure 2:
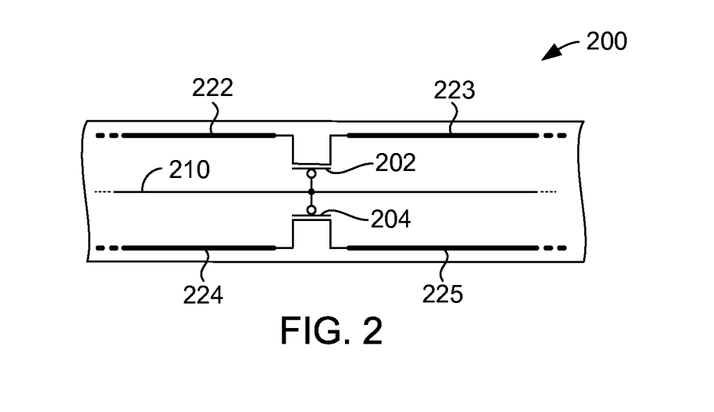
FIG. 2 is a plan view of a portion of an IC with test elements connecting power domain buses according to another embodiment.

FIG. 2 is a plan view of a portion of an IC 200 with test elements 202, 204 connecting power domain buses 222, 223, 224, 225 according to another embodiment. The portion of the IC 200 shown in FIG. 2 has four power domains, which are not separately indicated with reference numerals. Generally, the first power domain is above line 210 to the left of test element 202, the second power domain is above line 210 to the right of test element 202, the third power domain is below line 210 to the left of test element 204 and the fourth power domain is below line 210 to the right of test element 204 (compare, FIG. 1, ref. nums. 102, 106). Each power domain bus is associated with a corresponding independent power domain (compare, FIG. 1, power domain buses 122, 123). The test elements 202, 204 are PMOS transistors that connect the power domain buses together during IC electrical test, but which do not connect the power domains during IC operation. In other words, power domain bus 222 is connected to power domain bus 223 through PMOS transistor 202 during test, and is disconnected from power domain bus 223 during user operation. Power bus 222 is connected to power bus 223 in a neighboring power domain through PMOS transistor 202. In a further or alternate embodiment, a separate PMOS transistor (not shown) connects power bus 222 to power bus 224 or to power bus 226. In some embodiments, several power buses are connectable to several other power buses through PMOS transistors.

Wafer and chip test systems typically have a much lower number of probes than the number of solder bumps or pads on the packaged IC. While each power pad of each independent power domain may have a unique external connection point, the tester used at die sort, for example, might not have sufficient pins (probes) to power up each of the independent power domains. In some instances, an FPGA may have 100 or more independent power domains. The test elements connect independent power domains together for the purpose of electrical test so that a reduced number of test probes (i.e., fewer test probes than the number of independent power domains on the IC) may be used. In conventional ICs, the functional blocks of the IC are connected to the IC power distribution network, and only one or a few test probes are needed to contact and supply power to the power distribution network. The test elements 202, 204 allow ICs with independent power domains to be tested in a similar fashion to conventional ICs with an on-chip power distribution network. In a particular embodiment, an IC with test elements is tested using a single power (e.g., Vcc) probe. In operation, independent power domains of the IC 200 may be powered to different levels, such as voltages higher or lower than Vcc, or grounded to shut off an independent power domain.

The test elements 202, 204 do not need to be large transistors, like conventional power gating transistors are, because relatively little current flows through the test elements during the test sequence. The connecting test element transistors are engineered to shut off fully during operation of the IC according to a control signal provided on test control line 210. All test element transistors can be simultaneously turned on or off by connecting them to a common control line. In some embodiments, test element transistors are separated into subsets, each with its own control line. In some embodiments, test element transistors are controlled by configuration memory cells. Leakage current through a test element transistor from a powered domain to an unpowered domain can degrade the desired power savings. In a particular embodiment, the test element transistors are fabricated to be what are commonly referred to as high-threshold transistors. In a further embodiment, test element transistors are fabricated to have a relatively long channel length, and a relatively narrow gate width. Such transistors are slow when turned on, but have lower current leakage when turned off.

Figure 3:
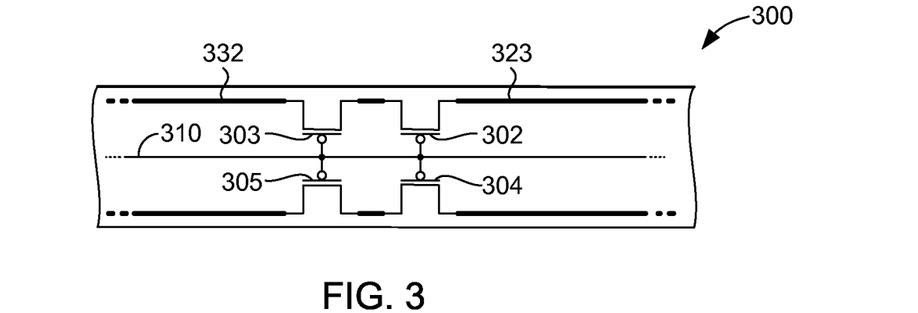
FIG. 3 is a plan view of a portion of an IC with serial test elements connecting power domain buses according to an alternative embodiment.

FIG. 3 is a plan view of a portion of an IC 300 with PMOS transistors in series according to another embodiment. The PMOS transistors 302, 303 are operated to connect power bus 323 to power bus 322 during test, and to isolate power bus 323 from power bus 322 during user operation of the device. Test control line 310 turns PMOS transistors 302, 303, 304, 305 on or off. Transistors in series lower the leakage current between independent power domains during user operations.

Figure 4:
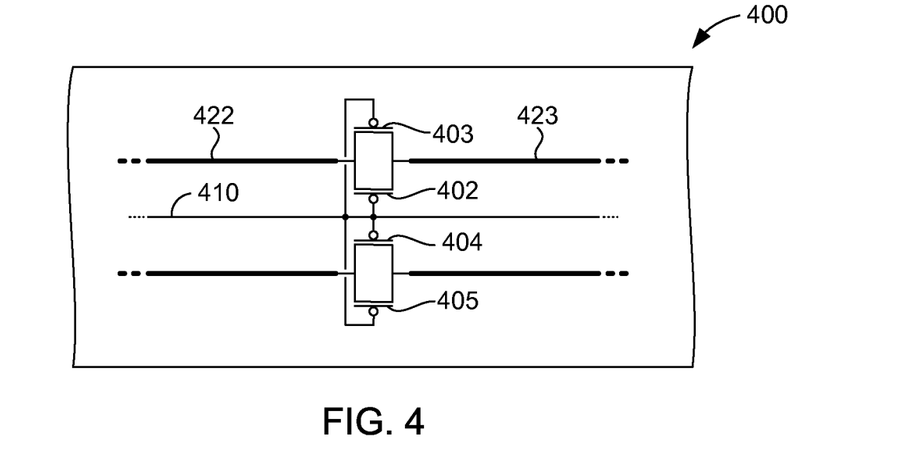
FIG. 4 is a plan view of a portion of an IC with parallel test elements connecting power domain buses according to an alternative embodiment.

FIG. 4 is a plan view of a portion of an IC 400 with PMOS transistors in parallel according to another embodiment. Test element transistors 402, 403 permit greater test current between power bus 422 and power bus 423 during testing. Parallel transistors also provide redundancy for yield improvement. Test element transistors 402, 403, 404, 405 are turned on and off according to a signal provided on test control line 410.

In an exemplary test environment, an FPGA is tested in a block-wise fashion, and the electrical test typically does not operate the FPGA at full speed or at full current draw. The electrical test procedure is tolerant of lower voltages and lower speeds than would be acceptable in an application, which might use much of the FPGA resources essentially simultaneously, and create much higher current draws between independent power domains. In a particular embodiment, the current draw between power domains during test is only about 1% of the maximum current draw expected to occur if the connected power domains were fully functioning in an application, with the power for one domain coming from the adjacent domain.

Figure 5:
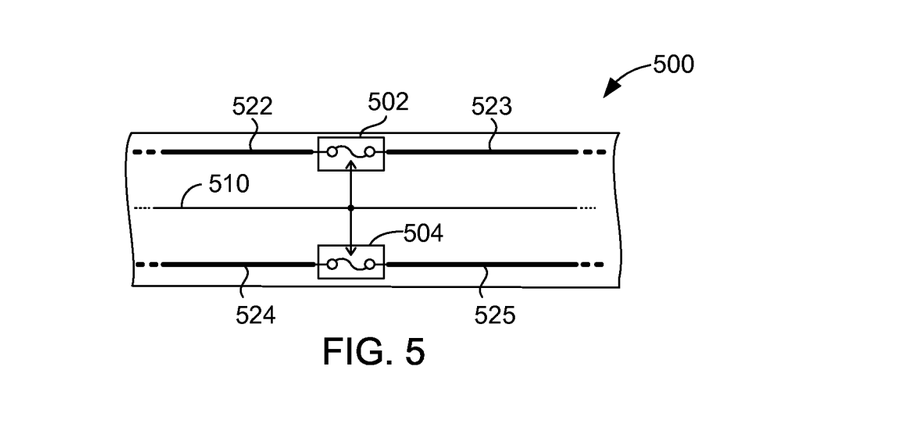
FIG. 5 is a plan view of a portion of an IC with fusible test elements connecting power domain buses according to an alternative embodiment.

FIG. 5 is a plan view of a portion of an IC 500 with fusible test elements 502, 504 connecting power domain buses 522, 523, 524, 525 according to another embodiment. The test elements 502, 504 are fuses that electrically connect power domain buses together during testing, and after IC electrical test are blown open. The independent power domains are connected during electrical test, and are disconnected during user operation. In a particular embodiment, a fuse control line 510 controls fusing of the test elements, and can globally fuse the test elements. Fuse control line 510 does not need to be probed during IC test, which simplifies the test fixture because a fuse control probe is not required. In an alternative embodiment, the fuses are selected so that they are unaffected by test current levels, but spontaneously fuse during the first power-up cycle of the IC for those test elements between used and unused power domains. Basically, the in-rush current from a powered domain to an adjacent unpowered domain blows the fuse. Other means may be used for test elements. For example, test elements may comprise nano-mechanical switches.

Figure 6:
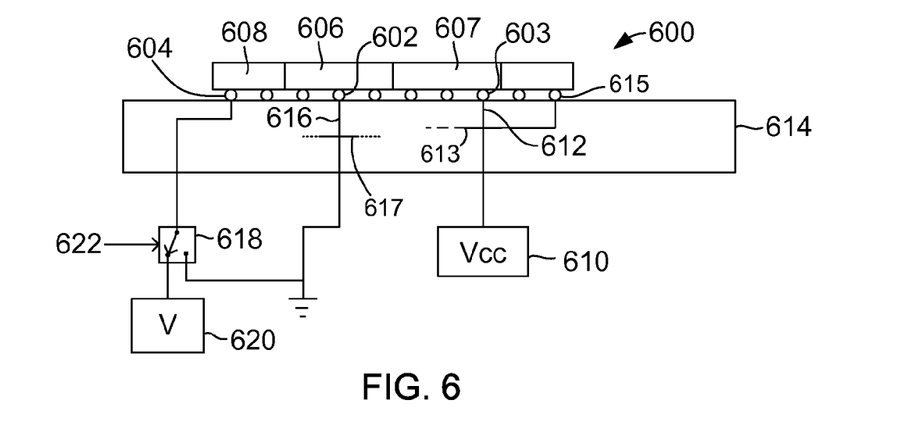
FIG. 6 is a simplified cross section of a packaged IC according to an embodiment.

FIG. 6 is a side view of a packaged IC 600 according to an embodiment. The packaged IC 600 has a ball grid array (BGA) or solder bump array (i.e., a pinout array) having external connectors (i.e., solder balls or solder bumps) 602, 603, 604 that are connected to power pads (see, e.g., FIG. 1, ref. nums 124, 125, 126) of independent power domains 606, 607, 608 of the IC. The external connectors (e.g., balls, bumps, or pads) of an IC that are connected in the IC to power pads of independent power domains will be referred to as independent power connectors for purposes of illustration, regardless as to whether they are connected to a power supply, are grounded, or are left floating. Additional connectors are shown as unconnected for simplicity and clarity of illustration. Those of skill in the art of IC packaging appreciate that BGA can have scores or even hundreds of balls.

The external connector 603 is connected to a power supply 610, such as the Vcc supply, through a trace 612 on a mounting substrate 614, which is a package substrate or printed wiring board, for example. The trace 612 is part of a power distribution network 613 that connects the power supply 610 to other independent power connectors (e.g., connector 615) of the IC. Similarly, the mounting substrate 614 has a ground distribution network 617 and a trace 616 that connects the external connector 602 of independent power domain 606 to ground, which disables the power domain 606 and reduces leakage current of the IC during operation. The functional blocks of the IC associated with independent power domain 606 are identified when the IC design is compiled, and those blocks are not used in the configured IC.

Independent power domain 608 and external connector 604 is connected to a switch 618 that selectively connects the independent power domain 608 to a voltage, such as to ground or to a power supply 620 according to a control signal on a control signal line 622. In a particular embodiment, the power supply 620 is the same voltage (or same power supply 610) as is connected to other active independent power domains. Alternatively, the power supply 620 supplies a higher or lower voltage than power supply 610, allowing resources (functional blocks) in the power domain 608 to operate at lower power consumption or higher speeds, for example. Switching the power domain 608 on or off through an external switch 618 avoids the voltage drop, heating, and silicon area associated with on-chip power gating techniques. In an alternative embodiment, the switch 618 is omitted and the power domain 608 is connected to the power supply 620 so that the resources in power domain 608 may operate at higher speed or lower power consumption. The pinout connectivity, which defines which pins are connected to which power supplies or ground, is generated when the user's design (application) is compiled. In a particular embodiment, the compile tool preferentially avoids placing resources in empty power domains so that the IC will operate with an unpowered power domain.

Figure 7:
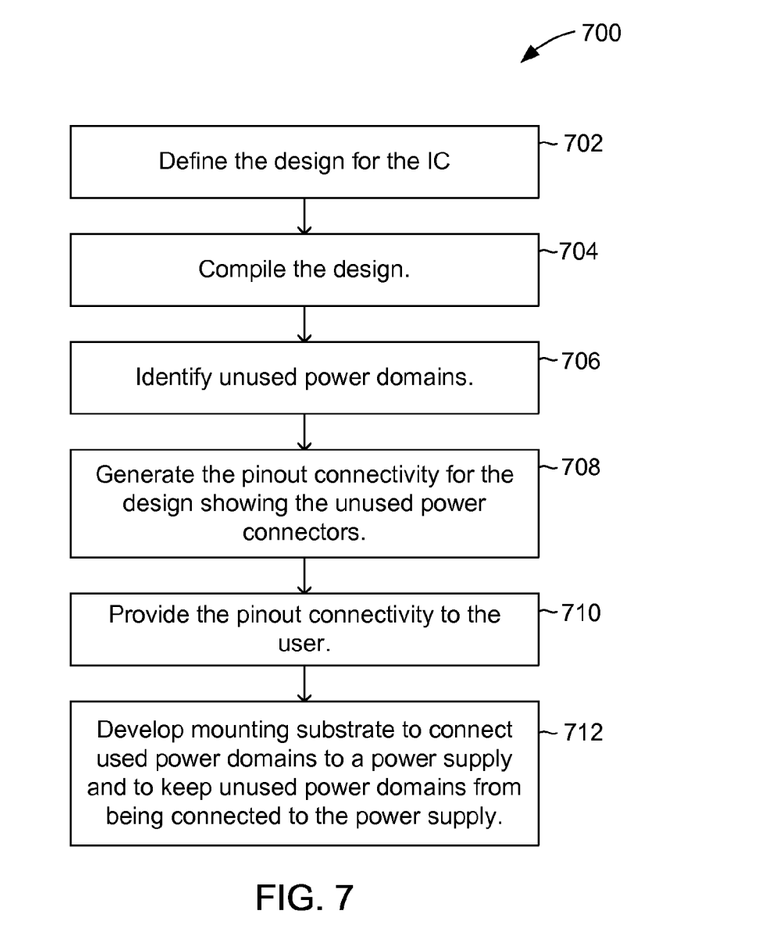
FIG. 7 is a flow chart of a method of using an IC according to an embodiment.

FIG. 7 is a flow chart of a method 700 of using an IC according to an embodiment. A design (application) is defined for the IC (step 702). In a particular embodiment, the IC is an FPGA, and the design does not require all resources of the FPGA. The FPGA has independent power domains and sufficient excess resources so that an independent power domain can remain unpowered (unused) while placing the design in the FPGA. The design is compiled (step 704) so that the resources in at least one independent power domain are not used. This power domain will be referred to as an unused power domain for purposes of discussion. In a particular embodiment, weighting factors are used in the compiler to avoid placing logic or other components of the design into an unused power domain, or to fill an existing power domain before placing components in another domain.

Unused power domain(s) are identified (step 706), and pinout connectivity for the design is generated (step 708), which includes showing (identifying) the power pins for unused power domains (unused power pins). In an alternative or further embodiment, speed files for features in the design are prepared for different voltage levels. The design is compiled (which may include preferentially leaving power domains empty or filling a power domain only with low-speed features, for example). Compiling is typically done using a tool commonly called a compiler. A compiler can be a dedicated design tool, typically including a processor, or a general purpose computer configured to operate as a complier according to programming instructions. The design is typically stored as a computer file, and optionally rendered in one or more physical forms, as is known in the art of IC design. The pinout connectivity includes power pins for domains that can operate at lower speed (low speed domains) without violating operational requirements, and these pins may then be connected to a lower voltage supply to reduce leakage current.

In a further embodiment, the pinout connectivity showing the unused power pins for the unused power domains is provided to a user (step 710), and the user develops a power supply connection requirement for the IC that connects the used and unused power pins as desired (step 712), such as to connect the unused power pins to ground, or to electrically tie them together and allow them to float, or otherwise connected. In a particular embodiment, all of the unused power pins are connected together on the mounting substrate or circuit board, which allows the user to power or de-power all the associated power domains by connecting or disconnecting the associated power distribution network to a power supply. The IC is assembled with the required connectivity and used in a system.

Figure 8:
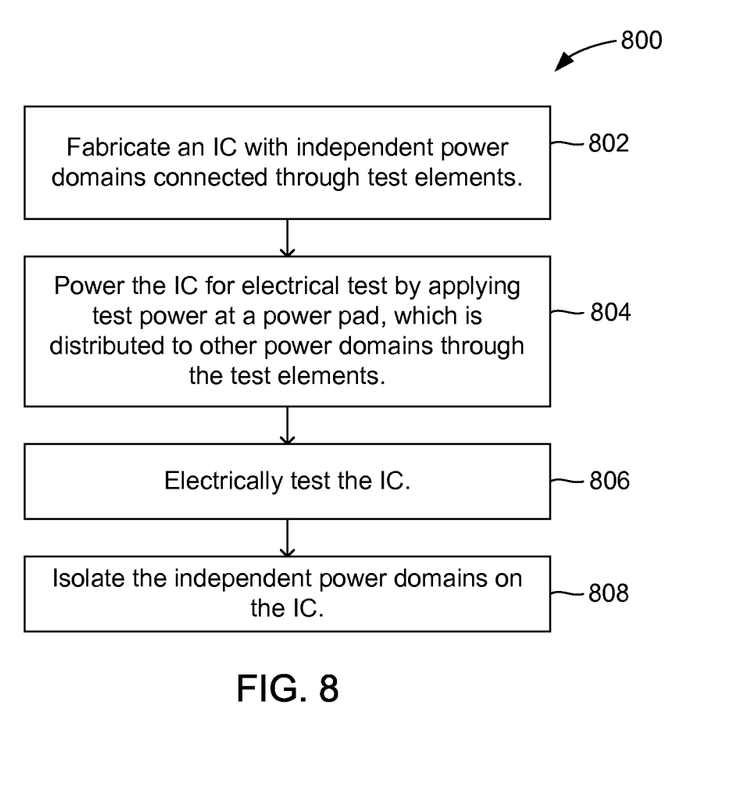
FIG. 8 is a flow chart of a method of testing an IC according to an embodiment.

FIG. 8 is a flow chart of a method 800 of testing an IC according to an embodiment. An IC with power domains connected together through test elements is provided (step 802). The test elements are fuses or switches, for example, and electrically connect power domains together during test, but then are blown or switched to electrically isolate one independent power domain from another for operation of the IC. Power is applied to the IC at a power pad(s) or pin(s) so that the power domains of the IC are powered for testing (step 804). In a particular embodiment, test power is applied to a single pin or pad of the IC. Generally, the number of pins or pads that test power is applied to is much less than the number of power domains on the IC.

In a particular embodiment, fuses distribute the test power from one power domain to another. In an alternative embodiment, a switch is turned on so as to connect one power domain to another. The switch is activated by a control signal applied to a pin or pad of the IC, or is alternatively generated at a node of the IC, such as by using a configuration cell (logic) in the fabric of the IC to generate the control signal at an internal node of the IC, which avoids needing a separate test pad and associated probe. Electrical test of the IC is performed (step 806) using a tool commonly referred to as a tester. A tester can be a dedicated test tool, typically including a processor, or a general purpose computer configured to operate as the tester according to programming instructions. The tester generally controls operation of the test fixture and the device under test by applying appropriate voltages and signals to the device and recording test values. Test results are typically stored as a computer-readable file, and optionally rendered in physical form, as is known in the art of IC electrical test. After electrical test, the power domains are isolated from each other to define independent power domains on the IC (step 808). In a particular embodiment, the switches between power domains are disconnected. In an alternative embodiment, fuses between power domains are blown.

Figure 9:
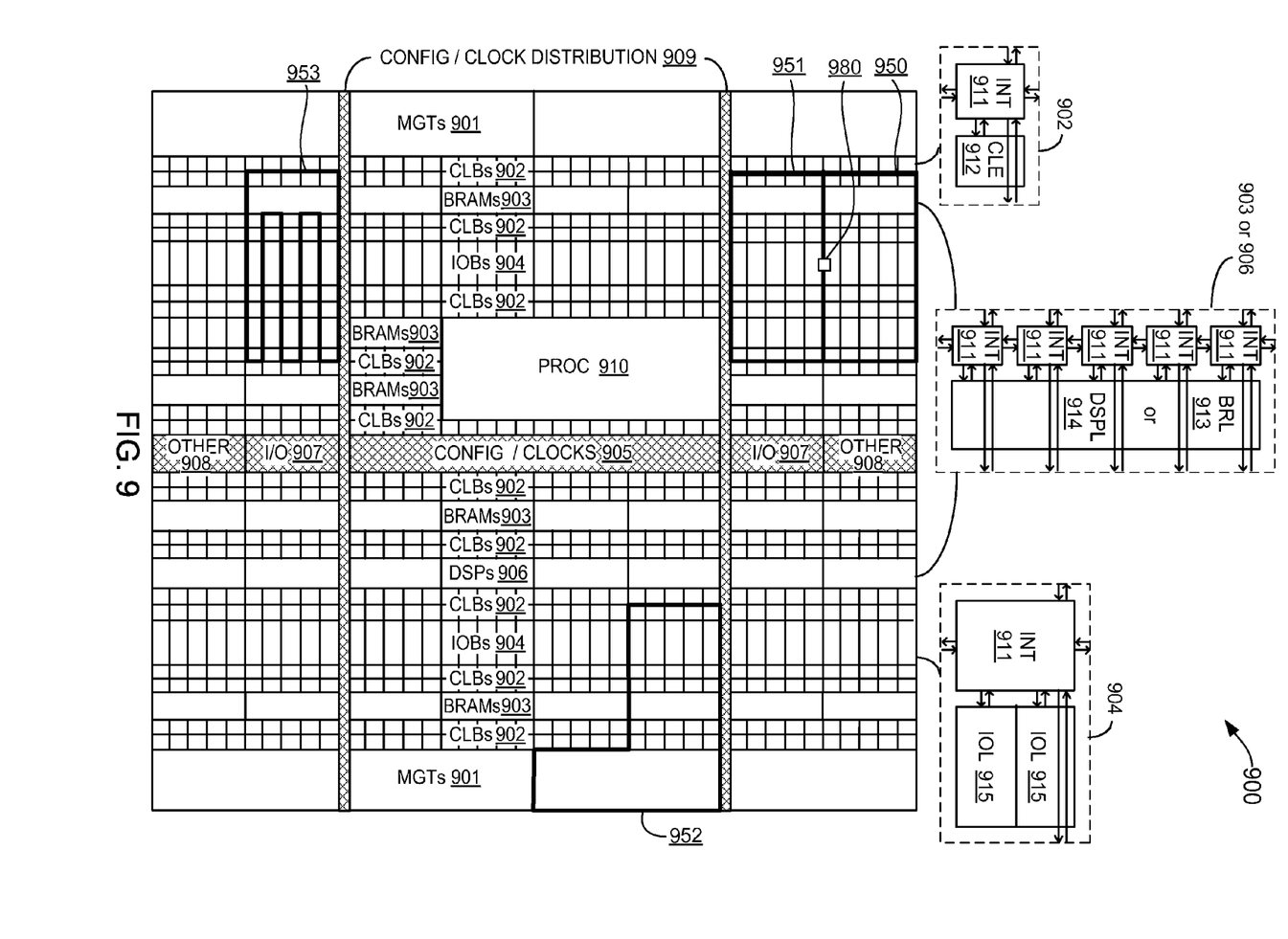
FIG. 9 is a plan view of an IC including a plurality of power domains according to one or more embodiments.

FIG. 9 is a plan view of an IC 900 including a plurality of power domains according to one or more embodiments. The IC 900 is an FPGA, but is alternatively a different type of IC, such as graphics processor, microprocessor, logic device or other IC. The FPGA is fabricated using a CMOS fabrication process or mixed CMOS/NMOS process. The IC has independent power domains 950, 951, 952, 953 (represented by bold lines over the floorplan of device resources). The independent power domains are merely exemplary for purposes of illustration to show that power domains may be of any several configurations, and are not limited to rectangular domains. Each independent power domain has a power domain bus (not shown, see FIG. 1, ref. num. 122) that is fabricated in the physical device and distributes power to the resources in the associated power domain. Each independent power domain has at least one power pad (see, FIG. 1, ref. nums. 124, 126) connected to the power domain bus that is separately connectable to an external voltage. The power pads may be connected to a single power supply, or to different power supplies (not shown). In a further embodiment, a test element 980 between power domains electrically connected one power domain 950 to another 951 during test, but the test element does not connect independent power domains together during operation of the FPGA. In a particular embodiment, the test element 980 is a blown fuse between two power domain buses in a previously tested FPGA.

The FPGA architecture includes a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/ CLOCKS) 905, digital signal processing (DSP) blocks 906, specialized input/output blocks (I/O) 907 (e.g., configuration ports and clock ports), and other programmable logic 908 such as digital clock managers, analog-to-digital converters, system monitoring logic, and so forth. Some FPGAs also include dedicated processor blocks (PROC) 910. Horizontal areas 909 extending from the CONFIG/CLOCKS 905 column are used to distribute the clocks and configuration signals across the breadth of the FPGA 900.

In some FPGAs, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA. The programmable interconnect element (INT) 911 also includes the connections to and from the programmable logic element within the same tile, as shown by the examples included at the top of FIG. 9.

For example, a CLB 902 can include a configurable logic element (CLE 912) that can be programmed to implement user logic plus a single programmable interconnect element (INT) 911. A BRAM 903 can include a BRAM logic element (BRL) 913 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 906 can include a DSP logic element (DSPL) 914 in addition to an appropriate number of programmable interconnect elements. An 10B 904 can include, for example, two instances of an input/output logic element (IOL) 915 in addition to one instance of the programmable interconnect element (INT) 911. Some FPGAs utilizing the architecture illustrated in FIG. 9 include additional logic blocks that disrupt the regular columnar structure making up a large part of the FPGA. The additional logic blocks can be programmable blocks and/or dedicated logic. For example, the processor block PROC 910 shown in FIG. 9 spans several columns of CLBs and BRAMs. PROC 910 may comprise a single power domain or it may comprise multiple power domains or it may share a power domain with other blocks in FPGA 900.

Note that FIG. 9 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/ logic implementations included at the top of FIG. 9 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative power domain configuration and biasing techniques, including sequential biasing and re-configuration of FPGAs with selectable powering or depowering of independent power domains are alternatively or additionally used. Therefore, the spirit and scope of the appended claims should not be limited to the foregoing description.

The invention claimed is:

1. An integrated circuit (IC) comprising:
a first independent power domain having a first power domain bus electrically connected to first functional blocks and a first power pad electrically connected to the first power domain bus;
a second independent power domain having a second power domain bus electrically connected to second functional blocks and a second power pad electrically connected to the second power domain bus; and
a test element disposed between the first power domain bus and the second power domain bus;
wherein the test element is a switch controlled by a test control signal on a test control line, the switch being closed while electrically testing the IC and the switch being opened to isolate the first independent power domain from the second independent power domain on the IC; and
wherein the IC is a field programmable gate array and the test control signal is generated by a configuration cell in fabric of the field programmable gate array.

2. The IC of claim 1 wherein the test element electrically connects the first power domain bus to the second power domain bus during electrical testing of the IC and isolates the first power domain bus from the second power domain bus during user operation of the IC.

3. The IC of claim 1 wherein the first power pad is connected to a first independent power connector and the second power pad is connected to a second independent power connector, wherein the test element is in a non-conductive state.

4. The IC of claim 1 wherein the first power pad is connected to a first independent power connector that is connected to a first power supply providing a first voltage, and the second power pad is connected to a second independent power connector that is connected to a second power supply providing a second voltage.

5. The IC of claim 1 wherein the switch comprises a first transistor in series with a second transistor.

6. The IC of claim 1 wherein the switch comprises a first transistor in parallel with a second transistor.

7. The IC of claim 1 wherein the test element comprises a fuse.

8. The IC of claim 1 wherein the first power pad is electrically connected to a first power supply to provide power to the first functional blocks and the second power pad is electrically grounded to disable the second functional blocks.

9. The IC of claim 1 wherein the first power pad is electrically connected to a first power supply to provide power at a first voltage to the first functional blocks and the second power pad is electrically connected to a second switch, the second switch selectively connectable to the second power supply or to a second voltage.

10. The IC of claim 1 wherein the first independent power domain has equivalent functionality to the second independent power domain.

11. A method of testing an integrated circuit (IC) comprising:
    providing an IC having independent power domains connected together through test elements;
    applying test power to the IC at a power pad to power the independent power domains through the test elements;
    electrically testing, using a tester, the IC; and then
    isolating the independent power domains from each other on the IC;
    wherein the test elements are switches controlled by a test control signal on a test control line, the switches being closed while electrically testing the IC and the switches being opened to isolate the independent power domains from each other on the IC; and
    wherein the IC is a field programmable gate array and the test control signal is generated by a configuration cell in fabric of the field programmable gate array.

12. The method of claim 11 wherein the test elements are fuses and isolating independent power domains comprises blowing the fuses.

13. The method of claim 12 wherein the fuses are blown by providing operating current to the IC and operating the IC.

* * * * *